United States Patent
Hu et al.

(10) Patent No.: US 10,749,606 B2
(45) Date of Patent: Aug. 18, 2020

(54) PULSE GENERATION MODULE, AND OPTICAL COMMUNICATION TRANSMITTER SYSTEM AND NON-LINEAR EQUALIZING METHOD THEREOF

(71) Applicant: PhotonIC Technologies (Shanghai) Co., Ltd., Shanghai (CN)

(72) Inventors: Shang Hu, Shanghai (CN); Tingyu Yao, Shanghai (CN); Rui Bai, Shanghai (CN); Xuefeng Chen, Shanghai (CN); Pei Jiang, Shanghai (CN)

(73) Assignee: PhotonIC Technologies (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 16/503,476

(22) Filed: Jul. 4, 2019

(65) Prior Publication Data

US 2020/0059301 A1 Feb. 20, 2020

(30) Foreign Application Priority Data

Aug. 20, 2018 (CN) .................. 2018 1 09490362
Dec. 3, 2018 (CN) .................. 2018 1 1462335

(51) Int. Cl.
| | |
|---|---|
| *H04B 10/04* | (2006.01) |
| *H04B 10/588* | (2013.01) |
| *H01S 3/09* | (2006.01) |
| *H01S 3/13* | (2006.01) |
| *H03K 19/20* | (2006.01) |

(Continued)

(52) U.S. Cl.
CPC ............. *H04B 10/588* (2013.01); *H01S 3/09* (2013.01); *H01S 3/13* (2013.01); *H03K 19/20* (2013.01); *H04B 10/07953* (2013.01); *H04B 10/504* (2013.01); *H04B 10/5057* (2013.01); *H04B 10/5161* (2013.01); *H04L 7/0075* (2013.01); *H04L 7/0331* (2013.01)

(58) Field of Classification Search
CPC .... H04B 10/508; H04B 10/524; H04B 10/40; H04B 10/2507; H04B 10/50; H04B 10/516; H04B 10/5059; H04B 10/5057; H04B 10/25137; H04B 10/58
USPC ....... 398/182, 183, 186, 188, 192, 193, 194, 398/195, 196, 189, 135, 136, 158, 159, 398/33, 38, 25, 26, 27
See application file for complete search history.

(56) References Cited

U.S. PATENT DOCUMENTS 7,676,161 B2 * 3/2010 Roberts ................ H04B 10/505
398/192
2008/0292311 A1 * 11/2008 Daghighian ........... H04B 10/40
398/9

* cited by examiner

Primary Examiner — Hanh Phan

(57) ABSTRACT

The present disclosure provides a pulse generation module, and an optical communication transmitter system and a non-linear equalizing method thereof, the pulse generation module includes: a mode detector that outputs a corresponding effective detection signal after detecting a preset mode, a controller that generates a corresponding selection signal according to a jump mode, and an equalizing pulse generator that generates a corresponding equalizing pulse signal according to the effective detection signal and the selection signal. A jump mode of each piece of data in a data stream is detected, and a corresponding equalizing pulse signal is generated based on the detected jump mode, to compensate for nonlinearity of a laser driving signal. Information about a rising edge and a falling edge is determined by detecting a jump mode of data, a balanced current is provided for a particular purpose, and nonlinearity of a laser is compensated by current output.

19 Claims, 7 Drawing Sheets

(51) Int. Cl.
*H04B 10/079* (2013.01)
*H04B 10/50* (2013.01)
*H04B 10/516* (2013.01)
*H04L 7/00* (2006.01)
*H04L 7/033* (2006.01)

PULSE GENERATION MODULE, AND OPTICAL COMMUNICATION TRANSMITTER SYSTEM AND NON-LINEAR EQUALIZING METHOD THEREOF

CROSS REFERENCES TO RELATED APPLICATIONS

This application claims the benefits of priority to a Chinese Patent Application No. CN 2018109490362 filed on Aug. 20, 2018, and a Chinese Patent Application No. CN 201811462335X filed on Dec. 3, 2018, both of which entitled "Pulse Generation Module, and Optical Communication Transmitter System and Non-Linear Equalizing Method thereof", and the contents of which are incorporated herein by reference in its entirety.

BACKGROUND OF THE PRESENT DISCLOSURE

Field of Disclosure

The present disclosure relates to the field of optical communication, and in particular to a pulse generation module, and an optical communication transmitter system and a non-linear equalizing method thereof.

Description of Related Arts

With the rapid development of the communications industry and the rise of Internet plus, increased demands for the bandwidth of data transmission have been put forward. However, for a transmission line based on the conventional metal medium, due to a skin effect, a dielectric loss and other reasons, a large loss in transmission of high-frequency signals will become the bottleneck of high-rate data wire transmission. To perform high-rate data transmission, a large number of equalization technologies need to be used to compensate for the high-frequency loss of the line. Consequently, power consumption of an entire interface circuit is increased. Because of the negligible loss of optical fibers at high frequencies, optical fibers will inevitably become the ideal medium for future high-speed data transmission.

At present, the optical transmitter in the field of optical communication mainly has two modulation manners. One is a direct modulation laser transmitter, and the other is an external modulation transmitter. The direct modulation laser has a non-linear effect, which will not only affect the quality of an optical eye pattern (as shown in FIG. 1, the waveform in the optical eye pattern is chaotic), but also affect the bit error rate of a receiver. The nonlinearity is mainly caused by two reasons. One is the saturated nonlinearity of the optical power, and the other is the relaxation oscillation phenomenon that commonly exists in lasers.

SUMMARY OF THE PRESENT DISCLOSURE

The present disclosure provides an equalization technology that can improve the quality of the optical eye pattern of the transmitter, to implement communication without bit errors, thereby reducing the bit error rate of the entire optical communication link.

The present disclosure provides a pulse generation module, and an optical communication transmitter system and a non-linear equalizing method thereof, for resolving problems in the prior art such as poor quality of eye patterns, and a high bit error rate.

The present disclosure provides a pulse generation module, including: a mode detector, configured to receive a data stream, detect a jump mode of each piece of data in the data stream, and output a corresponding effective detection signal after detecting a preset mode, and a plurality of the preset modes is provided; a controller connected to an output end of the mode detector, the controller is configured to generate a corresponding selection signal according to the jump mode of the data stream, and the selection signal controls the equalizing pulse generator to output a pull-up pulse signal or a pull-down pulse signal as an equalizing pulse signal; and an equalizing pulse generator connected to the output end of the mode detector and an output end of the controller, the equalizing pulse generator is configured to generate the corresponding equalizing pulse signal according to the effective detection signal and the selection signal.

Preferably, the piece of data in the data stream includes two jump levels; the mode detector includes a first rising edge effective signal generation unit and a first falling edge effective signal generation unit; the first rising edge effective signal generation unit detects that two continuous bits of data are in a state of jumping from a low level to a high level, and the first falling edge effective signal generation unit detects that the two continuous bits of data are in a state of jumping from the high level to the low level.

More preferably, the first rising edge effective signal generation unit includes a first AND gate, and an input end of the first AND gate is separately connected to an inverted signal of a first bit of data and a second bit of data in two continuous bits of data signals, and outputs a first effective detection signal; the first falling edge effective signal generation unit includes a second AND gate, an input end of the second AND gate is separately connected to the first bit of data and an inverted signal of the second bit of data in the two continuous bits of data signals, and the second AND gate outputs a second effective detection signal.

More preferably, the mode detector further includes a setup mode detection unit, configured to detect that three continuous bits of data are in a state of jumping from the low level to the high level and then maintaining the high level, the setup mode detection unit includes a third AND gate, an input end of the third AND gate is separately connected to an inverted signal of a first bit of data, a second bit of data, and a third bit of data in three bits of data signals, and the third AND gate outputs a third effective detection signal.

Preferably, the piece of data in the data stream includes four jump levels: a first level, a second level, a third level, and a fourth level in ascending order; the mode detector includes a second rising edge effective signal generation unit, a third rising edge effective signal generation unit, a second falling edge effective signal generation unit, and a third falling edge effective signal generation unit; the second rising edge effective signal generation unit detects that two continuous bits of data are in a state of jumping from the first bit to the second level, the third level, or the fourth level; the third rising edge effective signal generation unit detects that the two continuous bits of data are in a state of jumping from the second level to the third level or the fourth level; the second falling edge effective signal generation unit detects that the two continuous bits of data are in a state of jumping from the fourth level, the third level, or the second level to the first level; and the third falling edge effective signal generation unit detects that the two continuous bits of data are in a state of jumping from the fourth level to the second level or from the second level to the first level.

More preferably, the second rising edge effective signal generation unit includes a first NAND gate and a fourth AND gate; an input end of the first NAND gate is separately connected to inverted signals that are of a second bit of data in two continuous bits of data signals and that are in states of the second level, the third level, and the fourth level; an input end of the fourth AND gate is separately connected to an output end of the first NAND gate and AND logic signals of inverted signals that are of a first bit of data in the two continuous bits of data signals and that are in the states of the second level, the third level, and the fourth level; the fourth AND gate outputs a fourth effective detection signal.

The third rising edge effective signal generation unit includes a first NOR gate and a fifth AND gate; an input end of the first NOR gate is separately connected to inverted signals that are of the second bit of data in the two continuous bits of data signals and that are in states of the second level and the third level; an input end of the fifth AND gate is separately connected to an output end of the first NOR gate and AND logic signals of inverted signals that are of the first bit of data in the two continuous bits of data signals and that are in states of the third level and the fourth level, and the fifth AND gate outputs a fifth effective detection signal.

The second falling edge effective signal generation unit includes a second NAND gate and a sixth AND gate; an input end of the second NAND gate is separately connected to inverted signals that are of the first bit of data in the two continuous bits of data signals and that are in the states of the second level, the third level, and the fourth level; an input end of the sixth AND gate is separately connected to an output end of the second NAND gate and AND logic signals of the inverted signals that are of the second bit of data in the two continuous bits of data signals and that are in the states of the second level, the third level, and the fourth level, the sixth AND gate outputs a sixth effective detection signal.

The third falling edge effective signal generation unit includes a third NAND gate, a fourth NAND gate, and a seventh AND gate; an input end of the third NAND gate is separately connected to inverted signals that are of the second bit of data in the two continuous bits of data signals and that are in the states of the third level and the fourth level; an input end of the fourth NAND gate is separately connected to inverted signals that are of the first bit of data in the two continuous bits of data signals and that are in the states of the third level and the fourth level, an input end of the seventh AND gate is separately connected to an inverted output signal of the third NAND gate and an output end of the fourth NAND gate, and the seventh AND gate outputs a seventh effective detection signal.

Preferably, the controller is further configured to receive laser temperature information, and determine the selection signal according to the laser temperature information and the jump mode of the data stream.

Preferably, when the pulse generation module includes one equalizing pulse generator, all the effective detection signals form a signal stream and share the equalizing pulse generator.

Preferably, when the pulse generation module includes a plurality of the equalizing pulse generators, an input end of each of the equalizing pulse generators is connected to the effective detection signal corresponding to the preset mode, output ends of the equalizing pulse generators are connected together, and strengths of the equalizing pulse signals output by the equalizing pulse generators are different.

More preferably, the equalizing pulse generator includes a pull-up pulse selection unit, a pull-down pulse selection unit, a pull-up pulse generation unit, and a pull-down pulse generation unit; the pull-up pulse selection unit receives the selection signal and the effective detection signal; the pull-up pulse generation unit is connected to an output end of the pull-up pulse selection unit; when the selection signal selects a pull-up pulse output and the effective detection signal works, the pull-up pulse generation unit outputs a pull-up pulse signal; the pull-down pulse selection unit receives the selection signal and the effective detection signal; the pull-down pulse generation unit is connected to an output end of the pull-down pulse selection unit; when the selection signal selects a pull-down pulse signal output and the effective detection signal works, the pull-down pulse generation unit outputs a pull-down pulse signal.

More preferably, the pull-up pulse selection unit includes a fifth NAND gate, an input end of the fifth NAND gate is separately connected to the selection signal and the effective detection signal, and an output end of the fifth NAND gate outputs a pull-up pulse selection signal; the pull-down pulse selection unit includes a second NOR gate, an input end of the second NOR gate is separately connected to an inverted signal of the effective detection signal and the selection signal, and an output end of the second NOR gate outputs a pull-down pulse selection signal.

The present disclosure further provides an optical communication transmitter system, comprising: a clock data recovery module, which is configured to: process clock and data signals, and provide processed clock and data information; a pulse generation module, including a mode detector, the mode detector is configured to receive a data stream, detect a jump mode of each piece of data in the data stream, and output a corresponding effective detection signal after detecting a preset mode, and a plurality of the preset modes is provided; a controller connected to an output end of the mode detector, the controller is configured to generate a corresponding selection signal according to the jump mode of the data stream, and the selection signal controls the equalizing pulse generator to output a pull-up pulse signal or a pull-down pulse signal as an equalizing pulse signal; and an equalizing pulse generator connected to the output end of the mode detector and an output end of the controller, the equalizing pulse generator is configured to generate the corresponding equalizing pulse signal according to the effective detection signal and the selection signal; and the pulse generation module is connected to an output end of the clock data recovery module, and generates a corresponding equalizing pulse signal according to an output signal of the clock data recovery module; a temperature detection module connected to an input end of the pulse generation module, configured to measure a laser temperature, provide a detected temperature signal to the pulse generation module, and adjust a selection signal in the pulse generation module; a laser driving module connected to the output end of the clock data recovery module, and generating a laser driving signal according to the output signal of the clock data recovery module; and an addition module connected to an output end of the pulse generation module and an output end of the laser driving module, and the equalizing pulse signal output by the pulse generation module compensates for the laser driving signal to reduce a bit error rate of signal transmission.

The present disclosure further provides a non-linear equalizing method of an optical communication transmitter, including: detecting a jump mode of each piece of data in a data stream, and generating a corresponding selection signal based on a detected jump mode; and generating a corresponding equalizing pulse signal based on the jump mode and the selection signal, and each equalizing pulse signal compensates for nonlinearity of a laser driving signal in a pull-up or pull-down manner.

Preferably, a pull-down pulse signal is output when the piece of data jumps from a low level to a high level, and a pull-up pulse signal is output when the piece of data jumps from the low level to the high level and maintains the high level; and continuous pull-down pulse signals and pull-up pulse signals are output in a same data period when the piece of data jumps from the high level to the low level.

Preferably, continuous pull-down pulse signals and pull-up pulse signals are output in a same data period when the piece of data jumps from a low level to a high level; and the continuous pull-down pulse signals and pull-up pulse signals are output in the same data period when the piece of data jumps from the high level to the low level.

Preferably, the non-linear equalizing method of an optical communication transmitter further includes: adjusting a current direction of the equalizing pulse signal through a laser temperature, and when the laser temperature is higher than a preset temperature, a pull-up pulse signal is output when the piece of data jumps from a high level to a low level, and a pull-down pulse signal is output when the piece of data jumps from the low level to the high level and maintains the high level.

Preferably, the non-linear equalizing method of an optical communication transmitter further includes: controlling a strength of the equalizing pulse signal according to different jump modes.

Preferably, the piece of data in the data stream includes two jump levels.

Preferably, the piece of data in the data stream includes four jump levels.

As stated above, the pulse generation module, and the optical communication transmitter system and the non-linear equalizing method thereof consistent with the present disclosure have the following beneficial effects:

In the present disclosure, information about a rising edge and a falling edge is determined by detecting a jump mode of data, a balanced current is provided for a particular purpose, and nonlinearity of a laser is compensated by means of current outputs, so that an overshoot of the rising edge of an optical eye pattern can be improved, and a speed of the falling edge is accelerated, and jitter of the rising edge is reduced, thereby greatly improving the quality of the optical eye pattern, and improving communication without a bit error.

DESCRIPTION OF REFERENCE SIGNS

Figure 1:
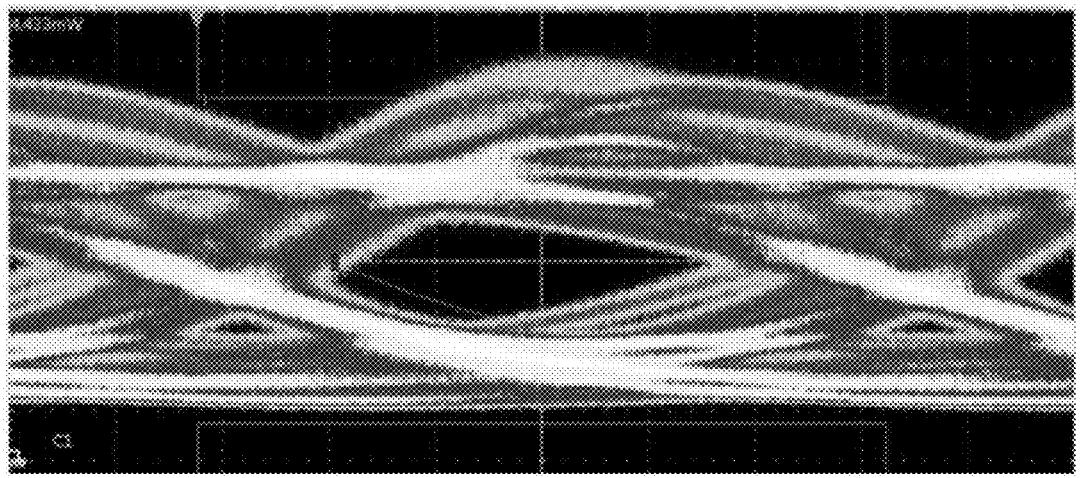
FIG. 1 is a schematic diagram of a traditional optical eye pattern.

1 Pulse generation module
11 Mode detector
111 First latch unit
112 Second latch unit
113 Third latch unit
114 First rising edge effective signal generation unit
115 First falling edge effective signal generation unit
116 Setup mode detection unit
12 Controller
13 Equalizing pulse generator
131 Pull-up pulse generation unit
132 Pull-down pulse generation unit
141a, 143a, 142b, 241, 243, 245, 247 Pull-down pulse signal
142a, 144a, 141b, 242, 244, 246, 248 Pull-up pulse signal
21 Mode detector
211 Phase inverter
212 Fourth latch unit
213 Fifth latch unit
214 Second rising edge effective signal generation unit
215 Second falling edge effective signal generation unit
216 Third rising edge effective signal generation unit
217 Third falling edge effective signal generation unit
23 Equalizing pulse generator
3 Clock data recovery module
4 Temperature detection module
5 Laser driving module
6 Addition module

DETAILED DESCRIPTION

The implementation mode of the present invention will be described below through specific embodiments. One skilled in the art can easily understand other advantages and effects of the present invention according to contents disclosed by the description. The present invention can also be implemented or applied through other different specific implementation modes. Various modifications or changes can also be made to all details in the description based on different points of view and applications without departing from the spirit of the present invention.

Referring to FIGS. 2-13. It needs to be stated that the drawings provided in the following embodiments are just used for schematically describing the basic concept of the present invention, thus only illustrating components only related to the present invention and are not drawn according to the numbers, shapes and sizes of components during actual implementation, the configuration, number and scale of each component during actual implementation thereof may be freely changed, and the component layout configuration thereof may be more complex.

Embodiment 1

Figure 2:
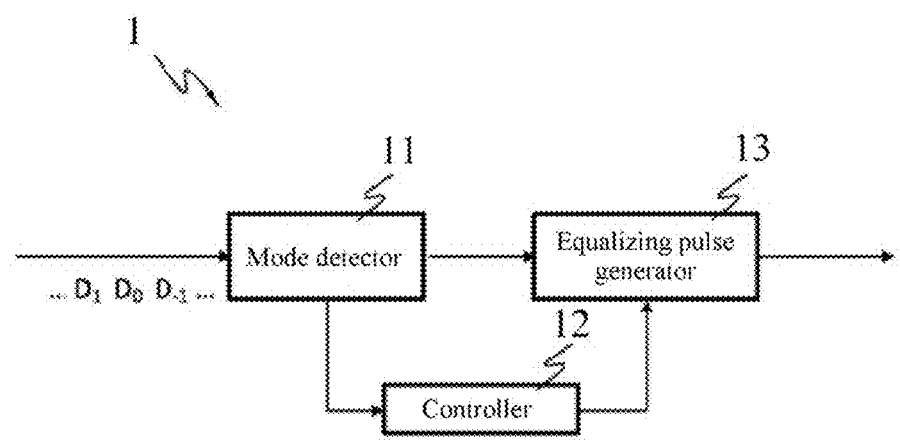
FIG. 2 is a schematic structural diagram of a pulse generation module consistent with the present disclosure.

As shown in FIG. 2, this embodiment provides a pulse generation module 1, including a mode detector 11, a controller 12, and an equalizing pulse generator 13.

As shown in FIG. 2, the mode detector 11 receives a data stream, detects a jump mode of each piece of data in the data stream, and outputs a corresponding effective detection signal after detecting a preset mode.

Specifically, as shown in FIG. 2, the data stream includes a plurality of serially transmitted digital signals, and each piece of data is denoted in sequence as: . . . D1, D0, D−1 . . . , where D−1 represents a previous piece of data, D0 represents a current piece of data, and D1 represent a next piece of data.

Figure 3:
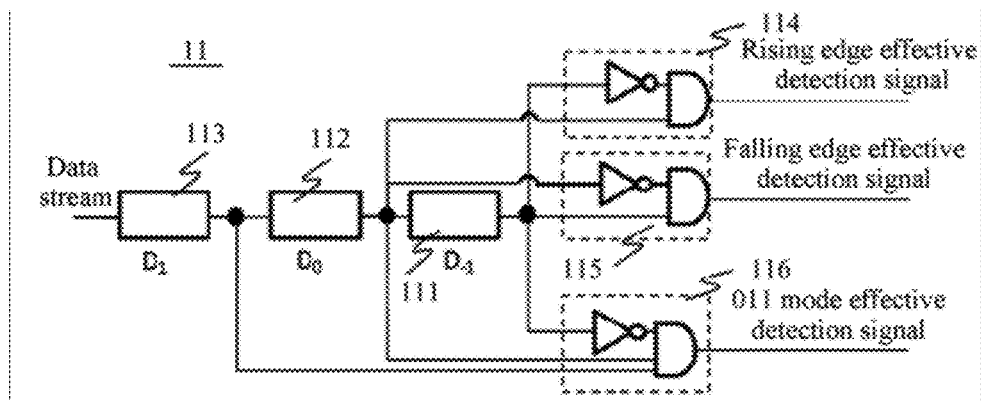
FIG. 3 is a schematic structural diagram of a mode detector consistent with the present disclosure.

Specifically, as shown in FIG. 3, the mode detector 11 includes three latch units, which are separately a first latch unit 111, a second latch unit 112, and a third latch unit 113. The third latch unit 113 is configured to latch a third bit of data D1 in three continuous bits of data, the second latch unit 112 is configured to latch a second bit of data D0 in the three continuous bits of data, and the first latch unit 111 is configured to latch a first bit of data D−1 in the three continuous bits of data. The latch units are edge-triggered latches, and include but are not limited to a D latch, and a D trigger. The mode detector 11 further includes a first rising edge effective signal generation unit 114, a first falling edge effective signal generation unit 115, and a setup mode detection unit 116.

More specifically, the first rising edge effective signal generation unit 114 detects that two continuous bits of data are in a state of jumping from a low level to a high level. In this embodiment, the first rising edge effective signal generation unit 114 includes a first AND gate, and an input end of the first AND gate is separately connected to an inverted signal of a first bit of data D−1 and a second bit of data D0 in two continuous bits of data signals, and when "D0 D−1" is "01", the first AND gate outputs a first effective detection signal (a rising edge effective detection signal). The inverted signal is obtained by using a phase inverter. The following table is a truth table of the first rising edge effective signal generation unit 114:

| $D_{-1}$ | $D_0$ | Rising edge effective detection signal |
|---|---|---|
| 0 | 0 | 0 |
| 0 | 1 | 1 |
| 1 | 0 | 0 |
| 1 | 1 | 0 |

More specifically, the first falling edge effective signal generation unit 115 detects that the two continuous bits of data are in a state of jumping from the high level to the low level. In this embodiment, the first falling edge effective signal generation unit 115 includes a second AND gate, and an input end of the second AND gate is separately connected to the first bit of data D−1 and an inverted signal of the second bit of data D0 in the two continuous bits of data signals; and when "D0 D−1" is "10", the second AND gate outputs a second effective detection signal (a falling edge effective detection signal). The inverted signal is obtained by using a phase inverter. The following table is a truth table of the first falling edge effective signal generation unit 115:

| $D_{-1}$ | $D_0$ | Falling edge effective detection signal |
|---|---|---|
| 0 | 0 | 0 |
| 0 | 1 | 0 |
| 1 | 0 | 1 |
| 1 | 1 | 0 |

More specifically, the setup mode detection unit 116 detects that three continuous bits of data are in a state of jumping from the low level to the high level and then maintaining the high level. In this embodiment, the setup mode detection unit 116 includes a third AND gate, an input end of the third AND gate is separately connected to the inverted signal of the first bit of data D−1, the second bit of data D0, and the third bit of data D1 in three bits of data signals; when "D1 D0 D−1" is "011", the third AND gate outputs a third effective detection signal (011 mode effective detection signal). The inverted signal is obtained by using a phase inverter. The following table is a truth table of the setup mode detection unit 116:

| $D_{-1}$ | $D_0$ | $D_1$ | 011 mode effective detection signal |
|---|---|---|---|
| 0 | 0 | 0 | 0 |
| 0 | 1 | 0 | 0 |
| 1 | 0 | 0 | 0 |
| 1 | 1 | 0 | 0 |
| 0 | 0 | 1 | 0 |
| 0 | 1 | 1 | 1 |
| 1 | 0 | 1 | 0 |
| 1 | 1 | 1 | 0 |

It should be noted that specific circuit structures of the first rising edge effective signal generation unit 114, the first falling edge effective signal generation unit 115, and the setup mode detection unit 116 are not limited, and any circuit structure that can implement a logical relationship of this embodiment is applicable to this embodiment. In this embodiment, each effective detection signal works at the high level, and in actual use, signal polarity may be adjusted to make each effective detection signal work at the low level, and this is not limited to this embodiment.

It should be noted that in this embodiment, the setup mode detection unit 116 is configured to detect a "011" mode. In actual use, another detection mode may be set according to requirements, or only a rising edge and a falling edge are detected, and this is not limited to this embodiment.

As shown in FIG. 2, the controller 12 is connected to an output end of the mode detector 11, and generates a corresponding selection signal according to the jump mode of the data stream; the selection signal controls the equalizing pulse generator 13 to output a pull-up pulse signal or a pull-down pulse signal as an equalizing pulse signal.

Specifically, the controller 12 is a programmable controller, and may implement control according to a logic defined by a user. The controller 12 obtains a detected jump mode according to an effective detection signal output by the mode detector 11, and generates a corresponding selection signal based on the jump mode, to determine a pull-up pulse signal output or a pull-down pulse signal output for compensation. The controller 12 further receives a laser temperature signal, and generates a corresponding selection signal according to the laser temperature signal and the jump mode, to compensate for a laser at a high temperature, and improve a bandwidth.

It should be noted that how to generate the selection signal, and how a level of the selection signal affects an output signal may be set according to specific requirements, and are not limited to this embodiment.

Specifically, the controller 12 includes but is not limited to a microcontroller, a digital signal processor (DSP), a microprocessor, an application-specific integrated ted circuit (ASIC), a field-programmable gate array (FPGA), or any suitable electronic element, and details are not described herein.

As shown in FIG. 2, the equalizing pulse generator 13 is connected to the output end of the mode detector 11 and an output end of the controller 12, and is configured to generate the corresponding equalizing pulse signal according to the jump mode of the data stream and the selection signal.

Figure 4:
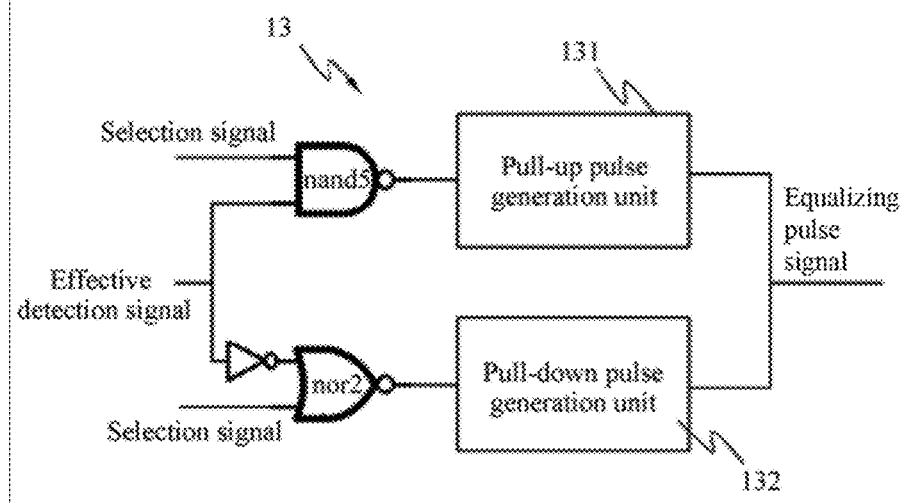
FIG. 4 is a schematic structural diagram of an equalizing pulse generator consistent with the present disclosure.

Specifically, as shown in FIG. 4, the equalizing pulse generator 13 includes a pull-up pulse selection unit, a pull-down pulse selection unit, a pull-up pulse generation unit 131, and a pull-down pulse generation unit 132.

More specifically, the pull-up pulse selection unit includes a fifth NAND gate NAND 5, an input end of the fifth NAND gate NAND 5 is separately connected to the selection signal and the effective detection signal; when the selection signal and the effective detection signal are both at high levels, the pull-up pulse selection unit outputs a pull-up pulse selection signal (low level), and the pull-up pulse generation unit 131 is selected. In this embodiment, effective detection signals received by the equalizing pulse generator 13 are a data stream formed by three groups of effective detection signals detected by the mode detector 11.

More specifically, the pull-up pulse generation unit 131 is connected to an output end of the fifth NAND gate NAND 5, to generate a pull-up pulse signal. In this embodiment, when the pull-up pulse selection signal is at the low level, the pull-up pulse generation unit 131 outputs an equalizing pulse signal.

More specifically, as shown in FIG. 4, the pull-down pulse selection unit includes a second NOR gate NOR 2; an input end of the second NOR gate NOR 2 is separately connected to an inverted signal of the effective detection signal and the selection signal; when the selection signal is at the low level and the effective detection signal is at the high level, the pull-down pulse selection unit outputs a pull-down pulse selection signal (high level), and the pull-down pulse generation unit 132 is selected.

More specifically, the pull-down pulse generation unit 132 is connected to an output end of the second NOR gate NOR 2, to generate a pull-down pulse signal. In this embodiment, when the pull-down pulse selection signal is at the high level, the pull-down pulse generation unit 132 outputs an equalizing pulse signal.

It should be noted that in this embodiment, one equalizing pulse generator is disposed; all the effective detection signals form a signal stream and share the equalizing pulse generator. In actual use, the number of the equalizing pulse generators may be set according to the number of preset modes. In this embodiment, the number of the equalizing pulse generators may be set to three; input ends of the equalizing pulse generators are separately connected to an effective detection signal corresponding to a preset mode; output ends of the equalizing pulse generators are connected together; strengths of equalizing pulse signals output by the equalizing pulse generators are different, and details are not described herein.

The equalizing pulse signal generated in this embodiment is used to compensate for nonlinearity of a laser.

A working principle of a pulse generation module 1 of this embodiment is as follows:

As shown in FIG. 2, a data stream enters the mode detector 11, and the mode detector 11 detects a jump mode of each piece of data in the data stream.

Specifically, as shown in FIG. 3, data is sequentially latched in the first latch unit 111, the second latch unit 112, and the third latch unit 113, and then two continuous pieces of data or three continuous pieces of data are detected; when it is detected that the two continuous pieces of data are in a state of jumping from the low level to the high level ("01"), the two continuous pieces of data are in a state of jumping from the high level to the low level ("10"), or three continuous pieces of data are in a state of jumping from the low level to the high level and then maintaining the high level ("011"), a corresponding effective detection signal works.

As shown in FIG. 2, the controller 12 obtains corresponding jump mode information according to each effective detection signal, and determines a selection signal according to the jump mode information to control the equalizing pulse generator 13 to output a pull-up pulse signal or a pull-down pulse signal as an equalizing pulse signal.

Specifically, the selection signal may be obtained through both the detected jump mode information and other preset conditions. The preset conditions include but are not limited to a laser temperature. A condition for obtaining the corresponding selection signal may be set through programming according to actual requirements, and this is not limited to this embodiment.

As shown in FIG. 2, the equalizing pulse generator 13 generates a corresponding equalizing pulse signal according to the effective detection signal and the selection signal.

Figure 5:
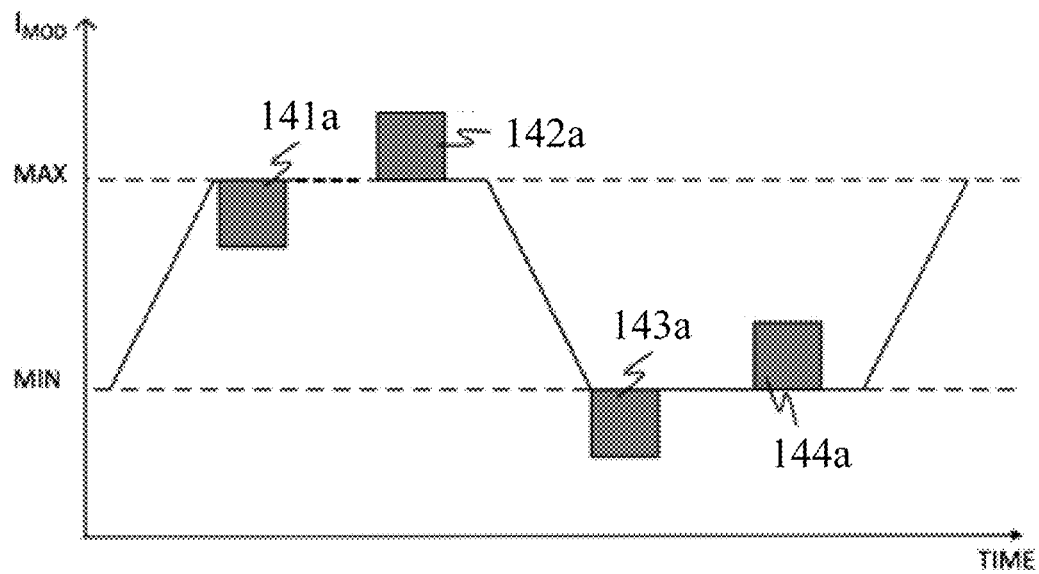
FIG. 5 is a schematic diagram of a principle of an implementation mode of non-linear compensation consistent with the present disclosure.

Specifically, as shown in FIG. 4 and FIG. 5, when the mode detector 11 detects "01", and a selection signal output by the controller 12 is at the low level, then the fifth NAND gate NAND 2 is at the high level, the pull-up pulse generation unit 131 is not gated, the second NOR gate NOR 2 outputs the high level, and the pull-down pulse generation unit 132 is gated. As shown in FIG. 4, the pull-down pulse selection signal works, and the pull-down pulse generation unit 132 outputs a pull-down pulse signal. As shown in FIG. 5, the pull-down pulse signal 141a is used to alleviate an overshoot of a rising edge. A horizontal coordinate represents time t, and a longitudinal coordinate represents modulation current Imod. In this embodiment, the modulation current Imod is a driving signal sent by a light driver, and the pull-down pulse signal 141a compensates for the modulation current Imod.

Specifically, similarly, when "011" is detected, the controller 12 controls the equalizing pulse generator 13 to output a pull-up pulse signal 142a, and the pull-up pulse signal 142a is used to alleviate jitter of the high level. A specific control process is similar to the above description, and details are not described herein.

Specifically, similarly, when "10" is detected, the controller 12 controls the equalizing pulse generator 13 to output a pull-down pulse signal 143a at first, to accelerate a speed of a falling edge, and then output a pull-up pulse signal 144a; the pull-up pulse signal 144a and the pull-down pulse signal 143a are in a same data period; the pull-up pulse signal 144a is used to alleviate an overshoot of the falling edge. A specific control process is similar to the above description, and details are not described herein.

Figure 6:
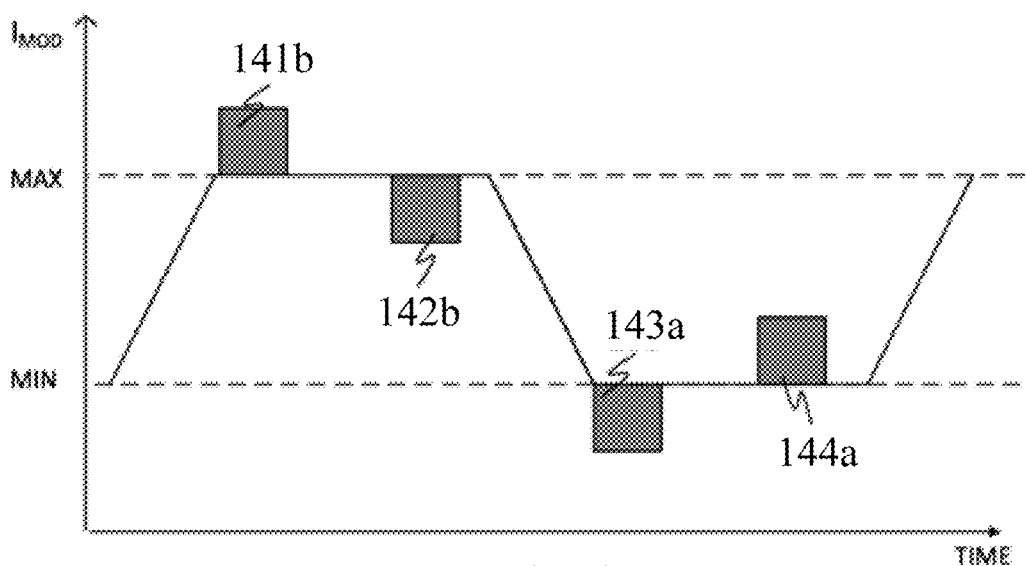
FIG. 6 is a schematic diagram of a principle of another implementation of non-linear compensation consistent with the present disclosure.

It should be noted that a laser driver may work under different conditions. In a period of time, laser driven by the modulation current Imod may work at a low temperature (for example, −20° C. to 0° C.); under this low temperature condition, a laser driving process may provide a sufficient bandwidth for optical communication of a digital signal stream (for example, 10 megahertzs); the equalizing pulse signal shown in FIG. 5 facilitates improving a Qierpu effect, thereby improving the shape of an optical eye pattern; in another period of time, laser driven by the modulation current Imod may work at a high temperature (for example, 50° C. to 90° C.). Under this high temperature condition, the laser driver may need to improve the bandwidth of the optical communication (for example, improve the bandwidth to 10 gigahertzs). As shown in FIG. 6, when the mode detector 11 detects "01", the controller 12 controls the equalizing pulse generator 13 to output a pull-up pulse signal 141*b*; and when "011" is detected, the controller 12 controls the equalizing pulse generator 13 to output a pull-down pulse signal 142*b*, thereby improving the bandwidth. A condition for obtaining the corresponding selection signal may be set through programming, and this is not limited to this embodiment.

Figure 7:
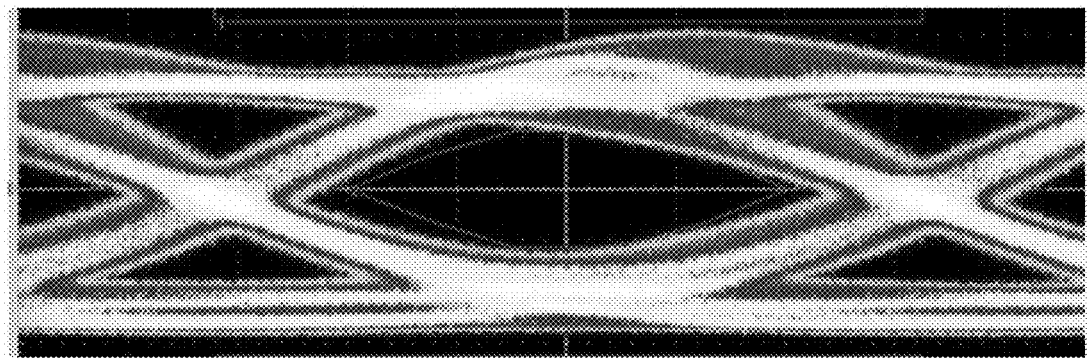
FIG. 7 is a schematic diagram of an optical eye pattern after compensation by using a non-linear equalizing method consistent with the present disclosure.

As shown in FIG. 7, the optical eye pattern compensated by using the module and the method according to this embodiment has clear and smooth lines, and the quality is greatly improved.

Embodiment 2

This embodiment provides a pulse generation module for fourth-order pulse amplitude modulation (PAM 4), and differs from Embodiment 1 in that, four jump levels of a data stream in the pulse generation module are provided.

Figure 8:
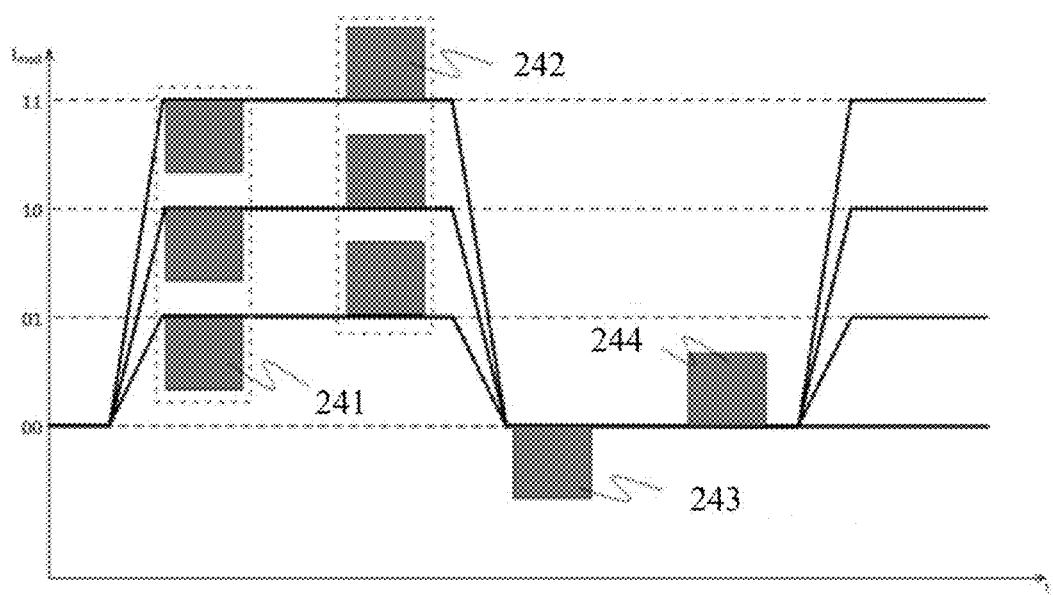
FIGS. 8-9 are schematic diagrams of a principle of another implementation mode of non-linear compensation consistent with the present disclosure.
Figure 9:
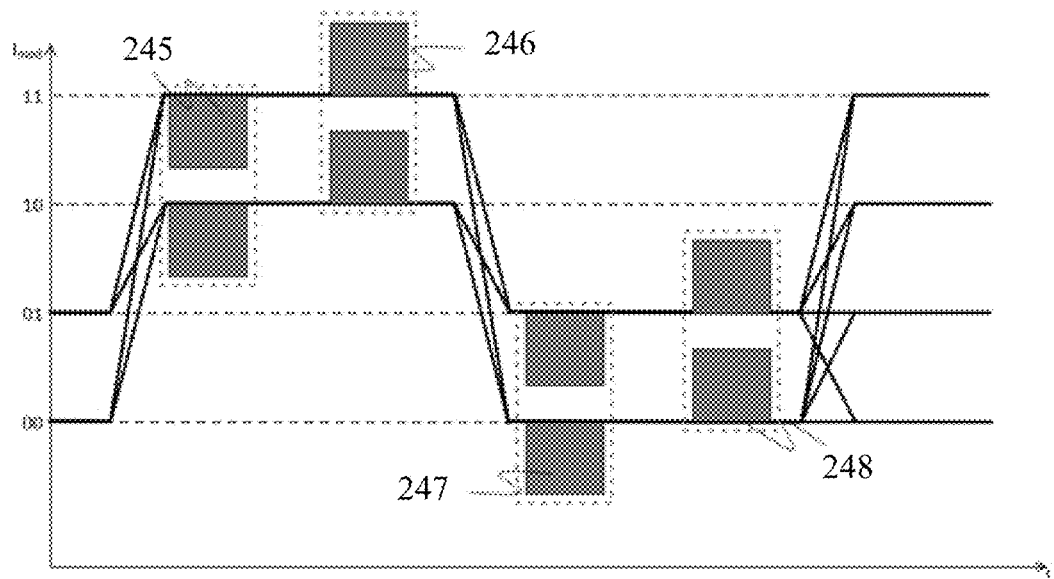
Figure 10:
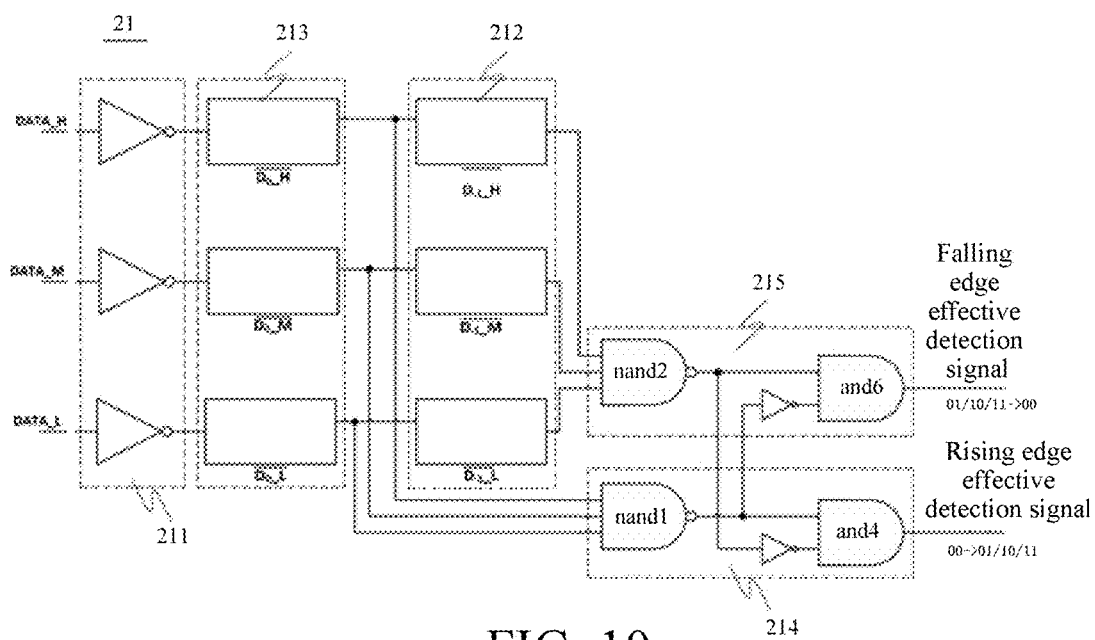
FIGS. 10-11 are schematic diagrams of another structure of a mode detector consistent with the present disclosure.
Figure 11:
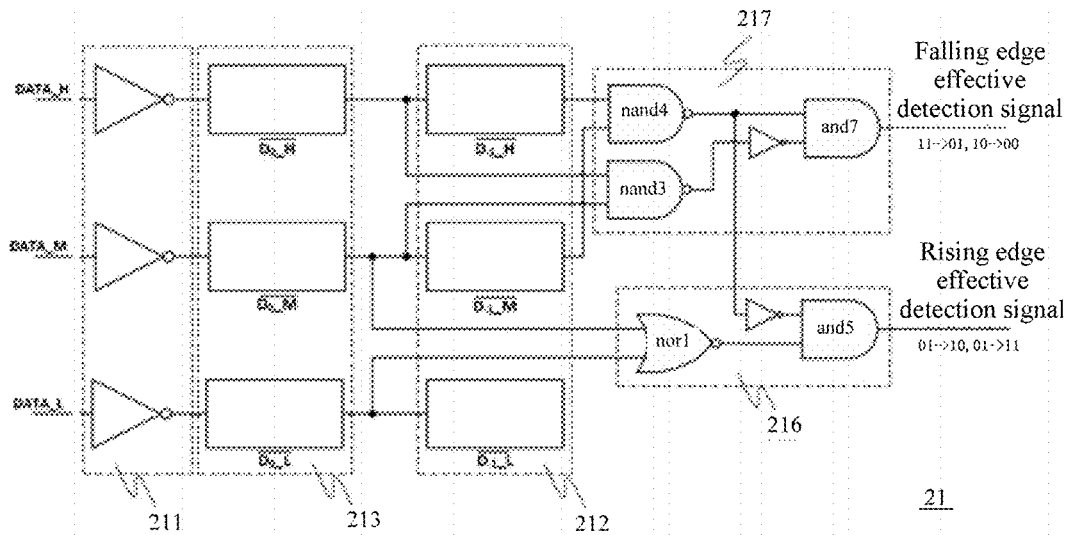

Specifically, as shown in FIG. 8 and FIG. 9, four jump levels are provided, which are sequentially a first level 00, a second level 01, a third level 10, and a fourth level 11 in ascending order. A mode detector 21 detects that a jump mode includes jumps between four levels. As shown in FIG. 10 and FIG. 11, the mode detector includes three groups of phase inverters 211, fifth latch units 213, and fourth latch units 212 that are sequentially connected in series, a second rising edge effective signal generation unit 214, a third rising edge effective signal generation unit 216, a second falling edge effective signal generation unit 215, and a third falling edge effective signal generation unit 217. The fourth latch unit 212 is configured to latch an inverted signal that is of a first bit of data in two continuous bits of data and that is in different level states. The fifth latch unit 213 is configured to latch an inverted signal that is of a second bit of data in the two continuous bits of data and that is in different level states. The second rising edge effective signal generation unit 214 detects that two continuous bits of data are in a state of jumping from the first level 00 to the second level 01, the third level 10, or the fourth level 11; the third rising edge effective signal generation unit 216 detects that the two continuous bits of data are in a state of jumping from the second level 01 to the third level 10 or the fourth level 11; the second falling edge effective signal generation unit 215 detects that the two continuous bits of data are in a state of jumping from the fourth level 11, the third level 10, or the second level 01 to the first level 00; and the third falling edge effective signal generation unit 217 detects that the two continuous bits of data are in a state of jumping from the fourth level 11 to the second level 01 or from the second level 01 to the first level 00.

More specifically, as shown in FIG. 10, the second rising edge effective signal generation unit 214 includes a first NAND gate NAND 1 and a fourth AND gate AND 4; an input end of the first NAND gate NAND 1 is separately connected to inverted signals that are of a second bit of data in two continuous bits of data signals and that are in states of the second level 01, the third level 10, and the fourth level 11 (separately corresponding to output ends of the fifth latch units 213); an input end of the fourth AND gate AND 4 is separately connected to an output end of the first NAND gate NAND 1 and an inverted output end of the second NAND gate NAND 2; and the fourth AND gate AND 4 outputs a fourth effective detection signal (the high level works).

More specifically, as shown in FIG. 11, the third rising edge effective signal generation unit 216 includes a first NOR gate NOR 1 and a fifth AND gate AND 5; an input end of the first NOR gate NOR 1 is separately connected to inverted signals that are of the second bit of data in the two continuous bits of data signals and that are in states of the second level 01 and the third level 10 (separately output ends corresponding to DATA_L and DATA_M in the fifth latch units 213); an input end of the fifth AND gate AND 5 is separately connected to an output end of the first NOR gate NOR 1 and an inverted output end of the fourth NAND gate NAND 4; and the fifth AND gate AND 5 outputs a fifth effective detection signal (the high level works).

More specifically, as shown in FIG. 10, the second falling edge effective signal generation unit 215 includes a second NAND gate NAND 2 and a sixth AND gate AND 6; an input end of the second NAND gate NAND 2 is separately connected to inverted signals that are of the first bit of data in the two continuous bits of data signals and that are in states of the second level 01, the third level 10, and the fourth level 11 (separately output ends of the fourth latch units 212); an input end of the sixth AND gate AND 6 is separately connected to an output end of the second NAND gate NAND 2 and an inverted output end of the first NAND gate NAND 1; and the sixth AND gate AND 6 outputs a sixth effective detection signal (the high level works).

More specifically, as shown in FIG. 11, the third falling edge effective signal generation unit 217 includes a third NAND gate NAND 3, a fourth NAND gate NAND 4, and a seventh AND gate AND 7. An input end of the third NAND gate NAND 3 is separately connected to inverted signals that are of the second bit of data in the two continuous bits of data signals and that are in states of the third level 10 and the fourth level 11 (separately output ends corresponding to DATA_M and DATA_H in the fifth latch units 213); an input end of the fourth NAND gate NAND 4 is separately connected to inverted signals that are of the first bit of data in the two continuous bits of data signals and that are in the states of the third level 10 and the fourth level 11 (separately output ends corresponding to DATA_M and DATA_H in the fourth latch units 212); an input end of the seventh AND gate AND 7 is separately connected to an inverted output end of the third NAND gate NAND 3 and an output end of the fourth NAND gate NAND 4, and the seventh AND gate AND 7 outputs a seventh effective detection signal (the high level works).

It should be noted that detecting jump states of four levels corresponding to three continuous bits of data is further included, and a specific circuit may be set according to actual requirements, and details are not described herein.

Figure 12:
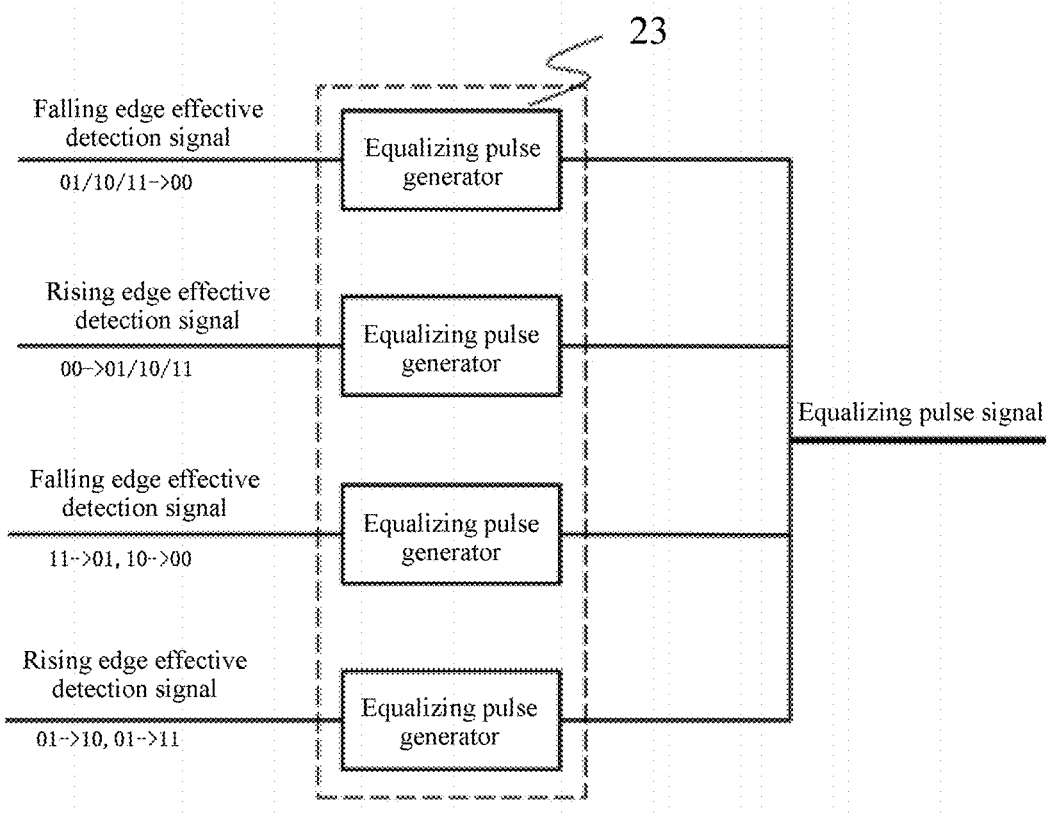
FIG. 12 is another schematic structural diagram of an equalizing pulse generator consistent with the present disclosure.

Specifically, as shown in FIG. 12, in this embodiment, four equalizing pulse generators 23 are disposed. Each equalizing pulse generator 23 is connected to an effective detection signal (fourth to seventh effective detection signals), and outputs a corresponding equalizing pulse signal according to a selection signal output by a controller. Output ends of the equalizing pulse generators 23 are connected together. Strengths of the equalizing pulse signals output by the equalizing pulse generators 23 are different, and strengths of the equalizing pulse signals may be set according to the detected modes or other requirements, and details are not listed herein.

It should be noted that the number of the equalizing pulse generators 23 may also be set to one, as shown in Embodiment 1. Details are not described herein.

Specifically, a "011" mode is not detected in this embodiment. After any rising edge effective detection signal is detected, continuous pull-down pulse signals and pull-up pulse signals are output in a same data period, to alleviate overshoot and jitter of the rising edge.

Other principles are the same as those of Embodiment 1, and details are not described herein.

It should be noted that the effective level state in Embodiment 1 and Embodiment 2 may be set according to requirements, and is not limited to this embodiment.

Embodiment 3

Figure 13:
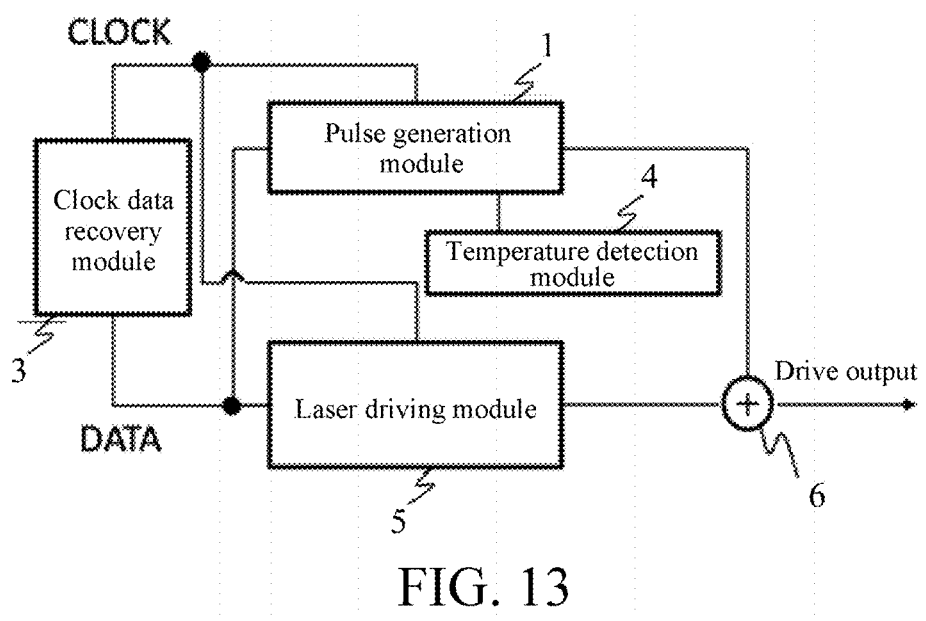
FIG. 13 is a schematic structural diagram of an optical communication transmitter system consistent with the present disclosure.

As shown in FIG. 13, this embodiment provides an optical communication transmitter system, including: a clock data recovery module 3, the pulse generation module 1, a temperature detection module 4, a laser driving module 5, and an addition module 6.

As shown in FIG. 13, the clock data recovery module 3 is configured to: process clock and data signals, and provide processed clock and data information.

Specifically, the clock data recovery (CDR) module 3 recovers an embedded clock from data, and rebuilds a received signal waveform by using an extracted clock signal to generate a recovered data signal. The clock signal extracted by the clock data recovery module 3 and a data signal recovered by the clock data recovery module 3 are full-rate signals or half-rate signals.

As shown in FIG. 13, the pulse generation module 1 is connected to an output end of the clock data recovery module 3, and generates a corresponding equalizing pulse signal according to an output signal of the clock data recovery module 3.

Specifically, referring to Embodiment 1 and Embodiment 2 for the structure and principle of the pulse generation module 1.

As shown in FIG. 13, the temperature detection module 4 is connected to an input end of the pulse generation module 1, to measure a laser temperature, provide a detected temperature signal to the pulse generation module 1, and adjust a selection signal in the pulse generation module 1.

Specifically, as shown in FIG. 6, when the laser temperature is higher than a set temperature, a pull-up pulse signal 141b is output when "01" is detected, and a pull-down pulse signal 142b is output when "011" is detected.

As shown in FIG. 13, the laser driving module 5 is connected to the output end of the clock data recovery module 3, and generates a laser driving signal according to an output signal of the clock data recovery module 3.

As shown in FIG. 13, the addition module 6 is connected to an output end of the pulse generation module 1 and an output end of the laser driving module 5, the equalizing pulse signal output by the pulse generation module 1 compensates for the laser driving signal to reduce a bit error rate of signal transmission.

In conclusion, the present disclosure provides a pulse generation module, and an optical communication transmitter system and a non-linear equalizing method thereof. The pulse generation module includes: the mode detector configured to receive a data stream, detect a jump mode of each piece of data in the data stream, and output a corresponding effective detection signal after detecting a preset mode; the controller connected to an output end of the mode detector, and the controller is configured to generate a corresponding selection signal according to the jump mode of the data stream, and the selection signal controls the equalizing pulse generator to output a pull-up pulse signal or a pull-down pulse signal as an equalizing pulse signal; and the equalizing pulse generator connected to the output end of the mode detector and an output end of the controller, and the equalizing pulse generator is configured to generate the corresponding equalizing pulse signal according to the effective detection signal and the selection signal. The jump mode of each piece of data in the data stream is detected, and the corresponding selection signal is generated based on the detected jump mode; the corresponding equalizing pulse signal is generated based on the jump mode and the selection signal, and each equalizing pulse signal compensates for nonlinearity of the laser driving signal in a pull-up or pull-down manner. In the present disclosure, information about a rising edge and a falling edge is determined by detecting a jump mode of data, a balanced current is provided for a particular purpose, and nonlinearity of a laser is compensated by means of current outputs, so that an overshoot of the rising edge of an optical eye pattern can be improved, and a speed of a falling edge is accelerated, and jitter of the rising edge is reduced, thereby greatly improving the quality of the optical eye pattern, and improving communication without a bit error. Therefore, the present disclosure effectively overcomes various disadvantages in the prior art and has high industrial utilization values.

The above description of the detailed embodiments is only to illustrate the preferred implementation according to the present disclosure, and it is not to limit the scope of the present disclosure. Modifications or variations of the above-described embodiments may be made by those skilled in the art without departing from the spirit and scope of the present disclosure. Therefore, all equivalent modifications or changes made by those skilled in the art without departing from the spirit and technical concept of the present disclosure should still fall within the scope of the present disclosure defined by the appended claims.

What is claimed is:
1. A pulse generation module, comprising:
    a mode detector, configured to
        receive a data stream,
        detect a jump mode of each piece of data in the data stream, and
        output a corresponding effective detection signal after detecting a preset mode, a plurality of the preset modes is provided;
    a controller connected to an output end of the mode detector, wherein the controller is configured to generate a corresponding selection signal according to the jump mode of the data stream, and the selection signal controls the equalizing pulse generator to output a pull-up pulse signal or a pull-down pulse signal as an equalizing pulse signal; and
    an equalizing pulse generator connected to the output end of the mode detector and an output end of the controller, wherein the equalizing pulse generator is configured to generate the corresponding equalizing pulse signal according to the effective detection signal and the selection signal.
2. The pulse generation module as in claim 1, wherein the piece of data in the data stream comprises two jump levels, the mode detector comprises a first rising edge effective signal generation unit and a first falling edge effective signal generation unit, the first rising edge effective signal generation unit detects that two continuous bits of data are in a state of jumping from a low level to a high level, and the first falling edge effective signal generation unit detects that the two continuous bits of data are in a state of jumping from the high level to the low level.

3. The pulse generation module as in claim 2, wherein the first rising edge effective signal generation unit comprises a first AND gate, an input end of the first AND gate is separately connected to an inverted signal of a first bit of data and a second bit of data in two continuous bits of data signals, and outputs a first effective detection signal, and the first falling edge effective signal generation unit comprises a second AND gate, an input end of the second AND gate is separately connected to the first bit of data and an inverted signal of the second bit of data in the two continuous bits of data signals, and the second AND gate outputs a second effective detection signal.

4. The pulse generation module as in claim 2, wherein the mode detector further comprises a setup mode detection unit, configured to detect that three continuous bits of data are in a state of jumping from the low level to the high level and then maintaining the high level, and the setup mode detection unit comprises a third AND gate, an input end of the third AND gate is separately connected to an inverted signal of a first bit of data, a second bit of data, and a third bit of data in three bits of data signals, and the third AND gate outputs a third effective detection signal.

5. The pulse generation module as in claim 1, wherein the controller is further configured to receive laser temperature information, and determine the selection signal according to the laser temperature information and the jump mode of the data stream.

6. The pulse generation module as in claim 1, wherein when the pulse generation module comprises one equalizing pulse generator, all the effective detection signals form a signal stream and share the equalizing pulse generator.

7. The pulse generation module as in claim 1, wherein when the pulse generation module comprises a plurality of the equalizing pulse generators, an input end of each of the equalizing pulse generators is connected to the effective detection signal corresponding to the preset mode, output ends of the equalizing pulse generators are connected together, and strengths of the equalizing pulse signals output by the equalizing pulse generators are different.

8. The pulse generation module as in claim 1, wherein the equalizing pulse generator comprises a pull-up pulse selection unit, a pull-down pulse selection unit, a pull-up pulse generation unit, and a pull-down pulse generation unit, wherein the pull-up pulse selection unit receives the selection signal and the effective detection signal, the pull-up pulse generation unit is connected to an output end of the pull-up pulse selection unit, when the selection signal selects a pull-up pulse output and the effective detection signal works, the pull-up pulse generation unit outputs a pull-up pulse signal, the pull-down pulse selection unit receives the selection signal and the effective detection signal, the pull-down pulse generation unit is connected to an output end of the pull-down pulse selection unit, and when the selection signal selects a pull-down pulse signal output and the effective detection signal works, the pull-down pulse generation unit outputs a pull-down pulse signal.

9. The pulse generation module as in claim 8, wherein the pull-up pulse selection unit comprises a first NAND gate, an input end of the first NAND gate is separately connected to the selection signal and the effective detection signal, and an output end of the first NAND gate outputs a pull-up pulse selection signal, and the pull-down pulse selection unit comprises a first NOR gate, an input end of the first NOR gate is separately connected to an inverted signal of the effective detection signal and the selection signal, and an output end of the first NOR gate outputs a pull-down pulse selection signal.

10. The pulse generation module as in claim 1, wherein the piece of data in the data stream comprises four jump levels: a first level, a second level, a third level, and a fourth level in ascending order, the mode detector comprises a first rising edge effective signal generation unit, a second rising edge effective signal generation unit, a first falling edge effective signal generation unit, and a second falling edge effective signal generation unit, the first rising edge effective signal generation unit detects that two continuous bits of data are in a state of jumping from the first bit to the second level, the third level, or the fourth level, the second rising edge effective signal generation unit detects that the two continuous bits of data are in a state of jumping from the second level to the third level or the fourth level, the first falling edge effective signal generation unit detects that the two continuous bits of data are in a state of jumping from the fourth level, the third level, or the second level to the first level, and the second falling edge effective signal generation unit detects that the two continuous bits of data are in a state of jumping from the fourth level to the second level or from the third level to the first level.

11. The pulse generation module as in claim 10, wherein the first rising edge effective signal generation unit comprises a first NAND gate and a first AND gate, wherein an input end of the first NAND gate is separately connected to inverted signals that are of a second bit of data in two continuous bits of data signals and that are in states of the second level, the third level, and the fourth level, an input end of the first AND gate is separately connected to an output end of the first NAND gate and AND logic signals of inverted signals that are of a first bit of data in the two continuous bits of data signals and that are in the states of the second level, the third level, and the fourth level, and the first AND gate outputs a third effective detection signal;

the second rising edge effective signal generation unit comprises a first NOR gate and a second AND gate, wherein an input end of the first NOR gate is separately connected to inverted signals that are of the second bit of data in the two continuous bits of data signals and that are in states of the second level and the third level, an input end of the second AND gate is separately connected to an output end of the first NOR gate and AND logic signals of inverted signals that are of the first bit of data in the two continuous bits of data signals and that are in states of the third level and the fourth level, and the second AND gate outputs a fourth effective detection signal;

the first falling edge effective signal generation unit comprises a second NAND gate and a third AND gate, wherein an input end of the second NAND gate is separately connected to inverted signals that are of the first bit of data in the two continuous bits of data signals and that are in the states of the second level, the third level, and the fourth level, an input end of the third AND gate is separately connected to an output end of the first NAND gate and AND logic signals of the inverted signals that are of the second bit of data in the two continuous bits of data signals and that are in the states of the second level, the third level, and the fourth level, and the third AND gate outputs a fifth effective detection signal; and the second falling edge effective signal generation unit comprises a third NAND gate, a fourth NAND gate, and a fourth AND gate, wherein an input end of the third NAND gate is separately connected to inverted signals that are of the second bit of data in the two continuous bits of data signals and that are in the states of the third level and the fourth level, an input end of the fourth NAND gate is separately connected to inverted signals that are of the first bit of data in the two continuous bits of data signals and that are in the states of the third level and the fourth level; an input end of the fourth AND gate is separately connected to an inverted output signal of the third NAND gate and an output end of the fourth NAND gate, and the fourth AND gate outputs a sixth effective detection signal.

12. An optical communication transmitter system, comprising:

a clock data recovery module, configured to:
process clock and data signals, and
provide processed clock and data information;

a pulse generation module, comprising
a mode detector, configured to receive a data stream, detect a jump mode of each piece of data in the data stream, and output a corresponding effective detection signal after detecting a preset mode, and a plurality of the preset modes is provided, a controller connected to an output end of the mode detector, wherein the controller is configured to generate a corresponding selection signal according to the jump mode of the data stream, and the selection signal controls the equalizing pulse generator to output a pull-up pulse signal or a pull-down pulse signal as an equalizing pulse signal, and an equalizing pulse generator connected to the output end of the mode detector and an output end of the controller, wherein the equalizing pulse generator is configured to generate the corresponding equalizing pulse signal according to the effective detection signal and the selection signal, wherein the pulse generation module is connected to an output end of the clock data recovery module, and generates a corresponding equalizing pulse signal according to an output signal of the clock data recovery module;

a temperature detection module connected to an input end of the pulse generation module, configured to
measure a laser temperature,
provide a detected temperature signal to the pulse generation module, and
adjust a selection signal in the pulse generation module;

a laser driving module connected to the output end of the clock data recovery module, and generating a laser driving signal according to the output signal of the clock data recovery module; and an addition module connected to an output end of the pulse generation module and an output end of the laser driving module, and the equalizing pulse signal output by the pulse generation module compensates for the laser driving signal to reduce a bit error rate of signal transmission.

13. A non-linear equalizing method of an optical communication transmitter, comprising:

detecting, by a mode detector, a jump mode of each piece of data in a data stream, and generating, by a controller, a corresponding selection signal based on a detected jump mode, and generating, by an equalizing pulse generator, a corresponding equalizing pulse signal based on the jump mode and the selection signal, and each equalizing pulse signal compensates for nonlinearity of a laser driving signal in a pull-up or pull-down manner.

14. The non-linear equalizing method of an optical communication transmitter as in claim 13, wherein a pull-down pulse signal is output when the piece of data jumps from a low level to a high level, and a pull-up pulse signal is output when the piece of data jumps from the low level to the high level and maintains the high level, and continuous pull-down pulse signals and pull-up pulse signals are output in a same data period when the piece of data jumps from the high level to the low level.

15. The non-linear equalizing method of an optical communication transmitter as in claim 13, wherein continuous pull-down pulse signals and pull-up pulse signals are output in a same data period when the piece of data jumps from a low level to a high level, and the continuous pull-down pulse signals and pull-up pulse signals are output in the same data period when the piece of data jumps from the high level to the low level.

16. The non-linear equalizing method of an optical communication transmitter as in claim 13, further comprising:

adjusting a current direction of the equalizing pulse signal through a laser temperature, and when the laser temperature is higher than a preset temperature, a pull-up pulse signal is output when the piece of data jumps from a high level to a low level, and a pull-down pulse signal is output when the piece of data jumps from the low level to the high level and maintains the high level.

17. The non-linear equalizing method of an optical communication transmitter as in claim 13, further comprising:

controlling a strength of the equalizing pulse signal according to different jump modes.

18. The non-linear equalizing method of an optical communication transmitter as in claim 13, wherein the piece of data in the data stream comprises two jump levels.

19. The non-linear equalizing method of an optical communication transmitter as in claim 13, wherein the piece of data in the data stream comprises four jump levels.

* * * * *